United States Patent [19]

Kudoh et al.

[11] Patent Number: 4,656,048
[45] Date of Patent: Apr. 7, 1987

[54] METHOD OF FORMING THICK FILM CIRCUIT PATTERNS WITH A SUFFICIENTLY WIDE AND UNIFORMLY THICK STRIP

[75] Inventors: Shinichi Kudoh; Akira Kabeshita; Syuichi Murakami, all of Osaka, Japan

[73] Assignee: Matsushita Electric Industrial Co., Ltd., Japan

[21] Appl. No.: 802,950

[22] Filed: Nov. 27, 1985

Related U.S. Application Data

[63] Continuation of Ser. No. 562,818, Dec. 15, 1983, abandoned.

[30] Foreign Application Priority Data

Dec. 16, 1982 [JP] Japan ................................. 57-221433
Dec. 20, 1982 [JP] Japan ................................. 57-224307

[51] Int. Cl.$^4$ ............................................. H05K 3/12
[52] U.S. Cl. .......................................... 427/8; 427/96; 427/102
[58] Field of Search ............................ 427/8, 96, 102

[56] References Cited

U.S. PATENT DOCUMENTS

| | | | |
|---|---|---|---|
| 4,133,910 | 1/1979 | Ruwe | 427/96 |
| 4,291,642 | 9/1981 | Kolc | 118/415 |
| 4,338,351 | 7/1982 | Bloom | 427/102 |
| 4,515,297 | 5/1985 | Schoenthaler | 427/96 |

Primary Examiner—John D. Smith
Attorney, Agent, or Firm—Lowe, Price, LeBlanc, Becker & Shur

[57] ABSTRACT

Disclosed is a method of forming a thick film circuit pattern according which involves moving a nozzle having a slit opening above the surface of a stationary substrate with the elongation of the slit opening being oriented at an angle to the direction of movement of the nozzle and forcing a paste in the nozzle downward through the slit opening onto the substrate to deposit a sufficiently wide and uniformly thick film strip. Preferably, the surface irregularities of the substrate are detected without contacting it for controlling the position of the slit opening above the substrate so that it follows closely parallel with the surface contour line of the substrate.

7 Claims, 14 Drawing Figures

FROM CONTROL UNIT 30

METHOD OF FORMING THICK FILM CIRCUIT PATTERNS WITH A SUFFICIENTLY WIDE AND UNIFORMLY THICK STRIP

This application is a continuation, of application Ser. No. 562,818, filed Dec. 15, 1983, now abandoned.

BACKGROUND OF THE INVENTION

The present invention relates to a method of forming a thick film circuit pattern. In particular, the present invention relates to a method of forming a thick film circuit pattern with a sufficiently wide and uniformly thick film strip applied at a high speed with precision.

Conventional thick-film forming methods are broadly classified into screen printing method and nozzle drawing method. The screen printing method involves preparation of a new screen each time a new circuit pattern is developed. While screen preparation takes a substantial amount of time, the screen method allows highly efficient printing and for this reason this method has been extensively used in mass production. In the trail stage of development where repeated attempts are made to obtain a desired circuit pattern, the drawing method is employed to take its advantage in that it allows full utilization of the capability of a computer to draw a circuit pattern according to a program that can be easily changed.

As illustrated in FIG. 1, conventional drawing methods involve the use of a drawing nozzle 3 having a circular opening through which thick-film paste 1 is ejected onto a substrate 2 and the nozzle 3 is moved relative to the substrate to form a desired circuit pattern. Nozzles of this type are particularly useful for producing a pattern having a small width in the range from 25 micrometers to 150 micrometers. As shown in FIG. 2 where a typical example of the nozzle 3 is illustrated, the nozzle opening usually has a diameter in the range from 50 micrometers to 200 micrometers. However, a measurement made by a surface roughness meter after baking revealed that the cross-section of the deposited film pattern took the shape of a semicircle having a large thickness (see FIG. 3) at the center. This thickness increases as the diameter of the drawing nozzle increases, making it difficult to deposit a film strip with a wide and uniform thickness. In the case of a resistive paste used for depositing resistors, large thickness makes it difficult to trim the resistance value. Use of a high power laser would produce microscopic cracks in the crystalline structure of the film which might result in a gradual change in resistance value and could lead to the loss of device reliability. For most applications the required cross-section of resistive film strips is 12 micrometers or less in thickness and about 1.0 millimeter in width. However, use of a circular nozzle that meets the thickness requirement of less than 12 micrometers would only result in a strip with a width of only 150 micrometers. The current practice thus involves forming closely spaced parallel strips until a desired width is attained. However, this is time consuming and often results in nonuniform thickness causing film-to-film variations.

Another prior art method employing the drawing nozzle 3 is shown in FIGS. 4 and 5 in which a stylus 5 is attached to the tip of the nozzle. The nozzle is moved with the stylus 5 in contact with the surface of the substrate 2 so that the nozzle opening follows the contour line of the surface irregularities of the substrate. Alternatively, the nozzle 3 is tilted in a manner shown in FIG. 6 and moved to the right in order to follow the surface contour of the substrate. Although these methods have proved successful to achieve uniformity in thickness, the surface of the substrate is impaired as shown at 6 in FIGS. 6 and 7 along the path of the moving stylus and nozzle end and such impairment affects the electric characteristics of the resistance measured after the pattern is baked. Another disadvantage of these methods resides in the fact that since the substrate is formed of a hard material such as ceramic, the stylus and the nozzle end are worn out by contact therewith requiring frequent replacement and that the nozzle speed is limited by their relatively poor rigidity. Because of the various disadvantages noted above, the prior art drawing nozzle is not applicable to mass production.

SUMMARY OF THE INVENTION

The present invention contemplates the use of a drawing nozzle with an opening in the shape of a slit. The method of forming a thick film circuit pattern according to the invention involves moving the drawing nozzle of the above noted structure at a distance above the surface of a stationary substrate with the elongation of the slit opening being oriented at an angle to the direction of movement of the nozzle and forcing a paste in the nozzle downward through the slit opening onto the substrate to form a desired thick film circuit pattern. The paste is ejected at a speed lower than the speed at which the nozzle is moved for forming on the substrate a paste film having a thickness smaller than the dimension of the slit opening. The present invention additionally provides a method which involves measuring the distance from a given level to the surface of the substrate without contacting it to detect its surface irregularities and controlling the nozzle position above the substrate according to the detected surface irregularities while the nozzle moves along the path of a circuit pattern so that the nozzle slit opening follows a path closely parallel with the surface contour of the substrate.

The present invention allows circuit designers to choose from a plurality of the above nozzles having slit openings of different slit lengths so that a desired film width can be obtained by moving the nozzle over a single pass.

An object of the present invention is therefore to enable depositing on a substrate a thick-film circuit pattern having a sufficiently wide and uniformly thick film strip with a high operating speed and precision without causing impairment on the surface of the substrate.

BRIEF DESCRIPTION OF THE DRAWINGS

The present invention will be described in further detail with reference to the accompanying drawings, in which.

DETAILED DESCRIPTION

Figure 1:
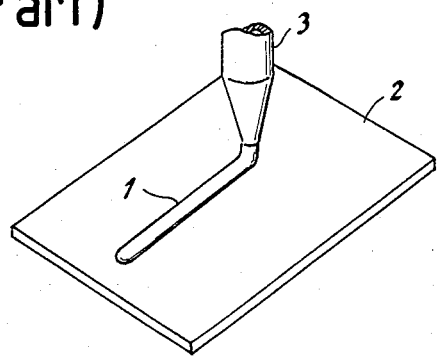
FIG. 1 illustrates a prior art drawing method used in forming a thick film circuit.
Figure 2:
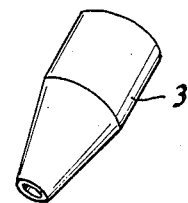
FIG. 2 is a perspective view of the drawing nozzle employed in the prior art method of FIG. 1.
Figure 3:
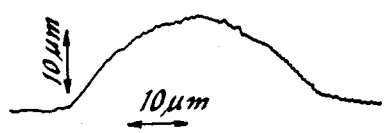
FIG. 3 is an illustration of the cross-section of a thick film strip deposited according to the prior art method of FIG. 1.
Figure 4:
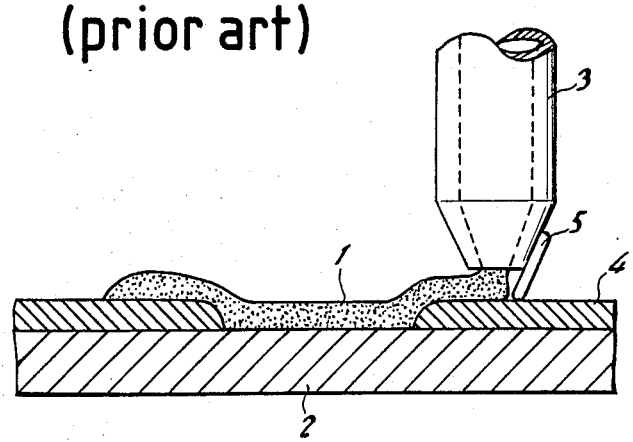
FIG. 4 illustrates another prior art drawing method employing a stylus attached to the tip of the nozzle of FIG. 2.
Figure 5:
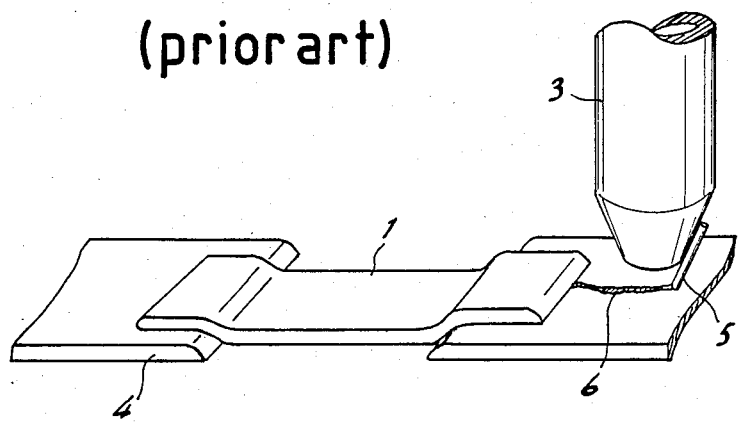
FIG. 5 illustrates the method of FIG. 4 in a perspective view.
Figure 6:
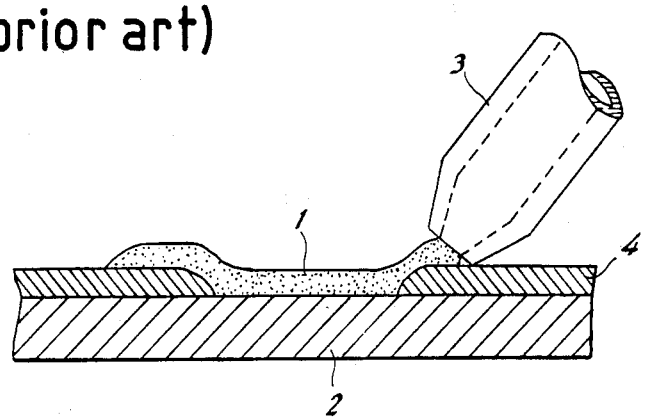
FIG. 6 illustrates a further prior art drawing method.
Figure 7:
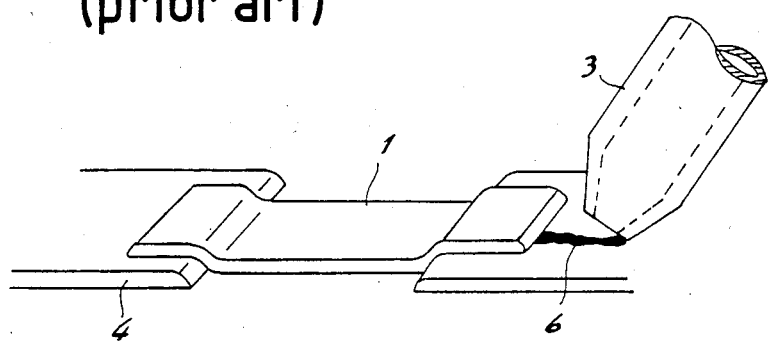
FIG. 7 illustrates the method of FIG. 6 in a perspective view.
Figure 8:
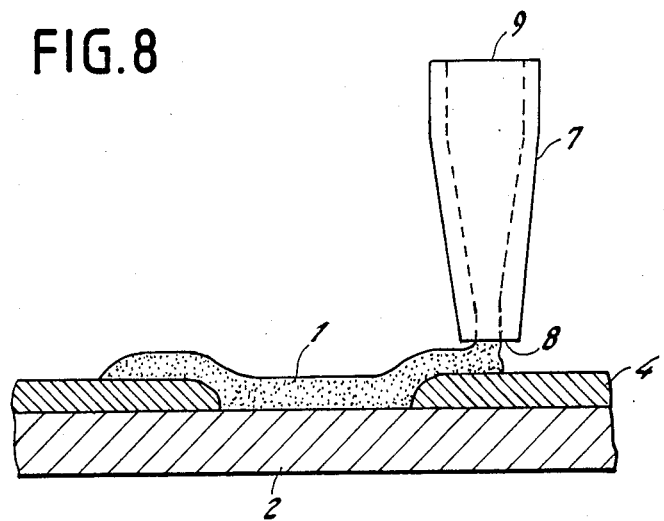
FIG. 8 illustrates in cross-section a drawing method according the present invention.
Figure 9:
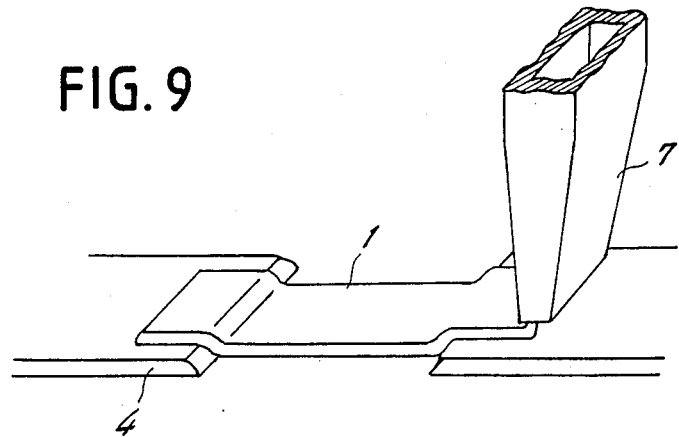
FIG. 9 illustrates the method of the invention in a perspective view.
Figure 10:
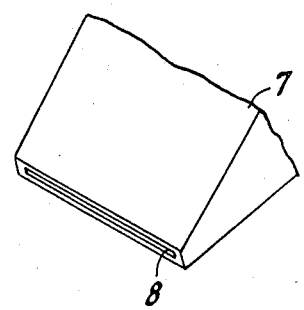
FIG. 10 is a perspective view of the nozzle employed in the present invention.

Referring now to FIGS. 8 and 9, a drawing method according to the present invention is illustrated. Indicated at 7 in an upright position is a nozzle having a slit opening 8 at the lower end thereof. The interior of the nozzle 7 is such that the upper opening at 9 is also in the shape of a slit larger than the nozzle opening 7. A paste 1 is deposited on a length of the substrate 2 which is formed of an aluminium oxide. The paste 1 is electrically resistive and composed of a ruthenium oxide. As shown in FIG. 10, the slit opening 8 typically has a width of 0.1 millimeters and a length of 1 millimeter. The drawing nozzle 7 is formed of stainless steel.

Figure 11:
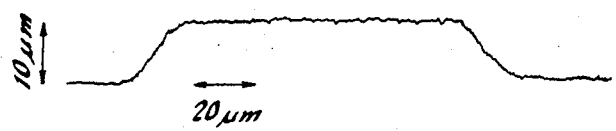
FIG. 11 is a cross-sectional view of a thick film strip deposited according to the method of the present invention.

According to an embodiment of the invention, the nozzle 7 was located 30 micrometers above the surface of the substrate and moved at a speed of 50 millimeters per second. The paste in the nozzle 7 was forced downward so that it was ejected through the nozzle opening under a pressure of 2 kilograms per square centimeter. FIG. 11 shows the cross-sectional view of the film strip formed according to the method performed under the above conditions. After baking a film strip of 10 micrometers thick and 1 millimeter wide was obtained.

Experiments showed that the width of the slit nozzle opening 8 is preferably in the range between 0.03 millimeters and 0.3 millimeters. More specifically, it was found no longer possible to obtain a sufficient amount of paste to be ejected with a slit opening of less than 0.03 millimeters even if the pressure applied to the nozzle is increased. With a slit opening of more than 0.3 millimeters it was found no longer possible to obtain a film thickness of 12 micrometers or less. The width of the slit opening 8 may vary in a range from 0.3 millimeters to 0.3 millimeters.

According to an alternative method of the present invention, the nozzle 7 is mounted on a vertical drive means, not shown, which is responsive to a signal applied thereto to move the nozzle 7 to adjust its height relative to the surface of the substrate 2. Prior to moving the nozzle 7, a measurement is made to detect the surface irregularities of the substrate 2 along the path of movement of the nozzle 7 by sending a laser beam from a laser measuring device and detecting the distance from a predetermined position to the surface of the substrate. From the laser measuring device is obtained a distance information signal which is applied to the actuator to operate it in a feedback loop. The vertical position of the nozzle 7 is controlled in accordance with the distance signal while it is moved along the path of the circuit pattern so that the slit opening 8 is kept a constant distance from the substrate following closely parallel with the surface contour line of the substrate. In an experiment, the slit opening 8 was able to maintain a distance of 30 micrometers from the substrate surface at all points. The preferred value of distance between the nozzle opening 8 and the surface of the substrate 2 was found to be in the range between 10 micrometers and 200 micrometers.

Figure 12:
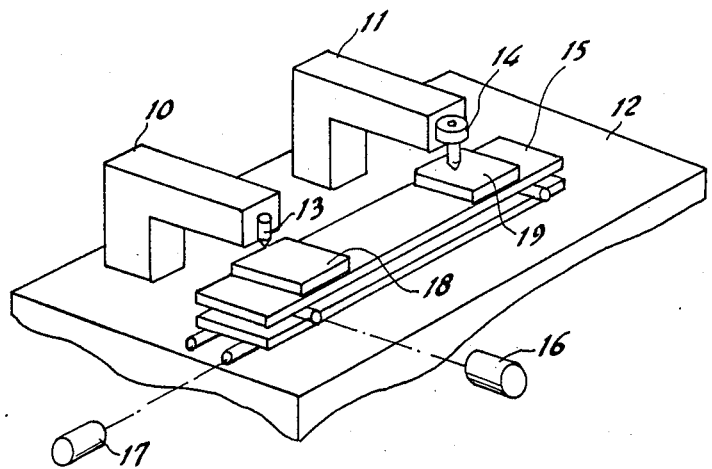
FIG. 12 is a perspective view of a drawing apparatus according to the invention.

FIG. 12 shows a drawing apparatus employed in the present invention. The apparatus comprises a pair of support arms 10 and 11 mounted on a work bench 12. The arms 10 and 11 carry at their distal ends a laser head 13 and a drawing head 14, respectively. Below the heads 13 and 14 are provided an X-Y table 15 of a conventional design which moves in orthogonal directions by means of an X-axis motor 16 and a Y-axis motor 17. On top of the X-Y table 15 are located substrates 18 and 19 in positions below the laser head 13 and drawing head 14, respectively, so that both substrates are driven in the same orthogonal directions simultaneously. The substrate 18 is illuminated with a laser beam emitted from the laser head 13. This laser head is coupled to a known laser measuring device to detect the distance to the surface of the substrate 18 and feeds an output signal to a control unit to be described later and register data representing the surface irregularities of the substrate 18. After the surface irregularities are measured, the substrate 18 is moved to the position of the substrate 19 where the drawing paste is injected from variable height in response to the registered data.

Figure 13:
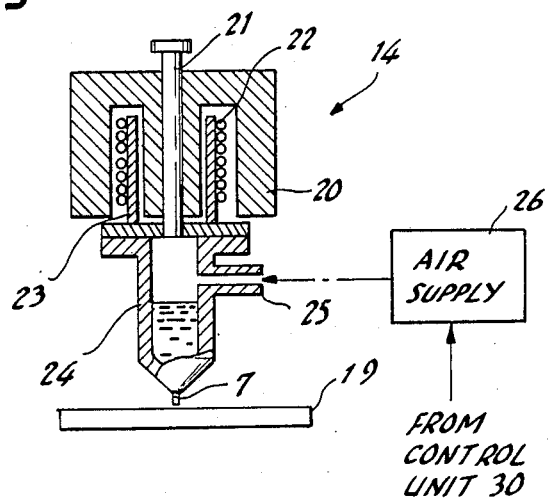
FIG. 13 is a cross-sectional view of a drawing head of the invention.

As shown in FIG. 13, the drawing head 14 comprises a cylindrical core 20 and a moving coil structure formed by a slide shaft 21 and a coil 22 wound on a bobbin 23. The slide shaft 21 extends through the center of cylindrical core 20 so that the moving coil 22 is movable in the core spacing in vertical directions in response to a signal applied thereto from the control unit. A paste reservoir 24 carries the nozzle 7 and is secured to the moving coil structure and provided with an inlet 25 through which pressurized air is supplied from an air supply 26 which is controlled by the control unit, so that the paste in the reservoir 24 is forced downward through the nozzle 7 onto the substrate 19.

Figure 14:
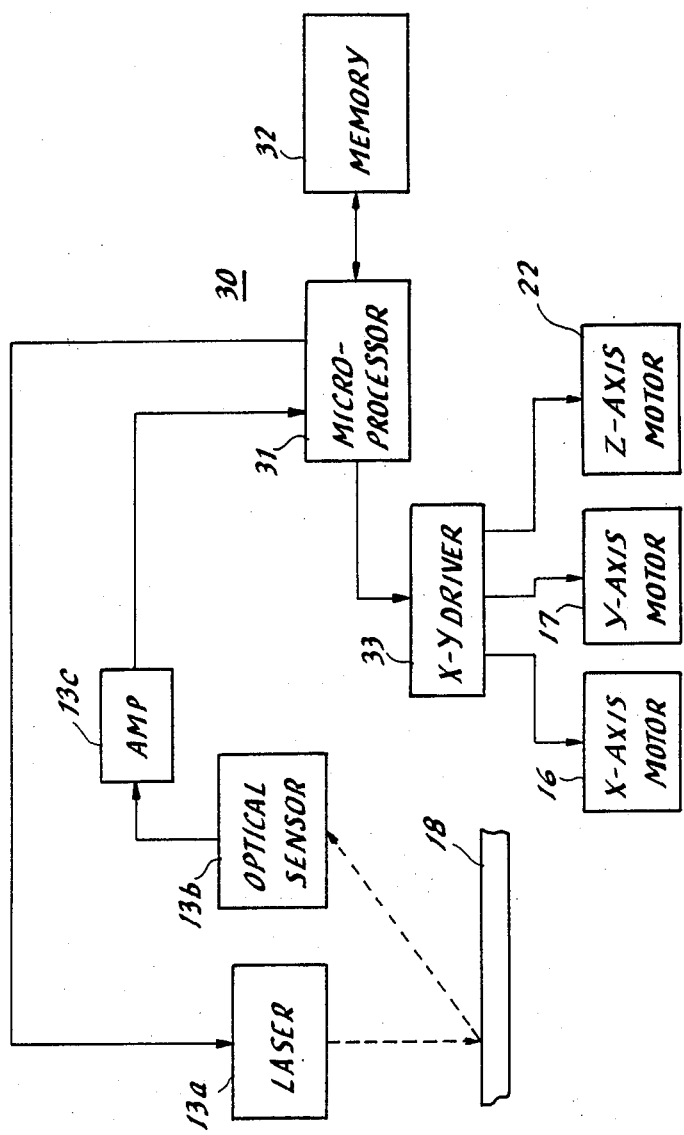
FIG. 14 is a block diagram of a control unit and associated devices.

In FIG. 14, the control unit, designated at 30, comprises a microprocessor 31 and a memory 32. The laser measuring head 13 includes a laser 13a and an optical sensor 13b and an amplifier 13c connected to the sensor 13b. The microprocessor 31 controls the laser 13a to emit a laser beam to the substrate 18. The optical sensor 13b senses the reflection of the laser beam off the substrate 18 and applies an output through the amplifier 13c to the microprocessor 31. The microprocessor 31 is programmed in a well known manner to measure the surface irregularities of the substrate 18 and continuously generate distance data as the substrate 18 is moved in orthogonal directions. The distance data are sequentially fed to the memory 32 to record the irregularity data of each substrate prior to being subject to the drawing process.

The X-axis motor 16 and Y-axis motor 17 are controlled by a known X-Y driver 33 which is in turn controlled by position control signals supplied from the microprocessor 31. The moving coil 22 of the drawing head 14 is designated a Z-axis motor which is also controlled by the X-Y driver in response to the registered distance data read from the memory 32.

In operation, the programmed instruction of the microprocessor 31 instructs the motors 16 and 17 to move to specified locations of the substrate 18 according to the desired circuit pattern. Therefore, the registered distance data indicate the surface irregularities of the specified paths of the circuit pattern, rather than the entire surface of the substrate. The substrate 18 is then moved to the position of the substrate 19. The microprocessor reads the memory 32 to retrieve the recorded distance data of the substrate 18 now moved to the position of substrate 19 and feeds the retrieved data to the driver 33 to the Z-axis motor 22, while at the same time moving the X-Y table 15 to follow the specified paths. The surface irregularities could equally be as well measured with the use of any one of no contact measuring devices which utilize optial, ultrasonic or magnetic medium.

What is claimed is:

1. A method of forming a thick film circuit pattern comprising the steps of moving a nozzle having a rectangular slit opening above the surface of a substrate with the elongation of the slit opening being oriented at an angle to the direction of movement of the nozzle, the dimension of said rectangular slit opening in the direction of movement being in the range from 0.03 millimeters to 0.3 millimeters, and forcing a paste in said nozzle downward with pressurized air through said slit opening onto the substrate so that the paste is ejected at a speed lower than the speed at which said nozzle is moved for forming on said substrate a film of said paste having a thickness smaller than said dimension of said slit opening.

2. A method as claimed in claim 1, further comprising measuring the surface irregularities of said substrate without contacting it and controlling the distance from said nozzle to said substrate according to the measured surface irregularities so that said slit opening follows closely parallel with the surface contour of said substrate.

3. A method as claimed in claim 1, further comprising:
measuring the surface irregularities of said substrate without contacting it and generating data representing the measured surface irregularities;
storing said data into a memory;
reading the stored data from the memory; and
controlling the distance from said nozzle to said substrate according to the data read from said memory so that said slit opening follows closely parallel with the surface contour of said substrate.

4. A method as claimed in claim 1, wherein the elongation of said slit opening is oriented perpendicularly to the direction of movement of the nozzle.

5. The method of claim 1, wherein said paste is an electrically resistive ruthenium oxide.

6. A method of forming a thick film circuit pattern comprising the steps of moving a nozzle having a rectangular slit opening above the surface of a substrate with the elongation of the slit opening being oriented at an angle to the direction of movement of the nozzle, and forcing a paste in said nozzle downward through said slit opening onto the substrate so that the paste is ejected at a speed lower than the speed at which said nozzle is moved for uniformly dispensing to form on said substrate a film of said paste having a thickness smaller than the dimension of said slit opening in the direction of movement of the nozzle.

7. The method of claim 6, wherein said nozzle is moved over the substrate at a generally constant speed during the formation of a thick film circuit line and said paste is ejected from said nozzle at a uniform flow rate during said formation of said substantially entire thick film circuit line.

* * * * *